(12) United States Patent
Shen et al.

(10) Patent No.: US 10,515,926 B2
(45) Date of Patent: Dec. 24, 2019

(54) SYSTEM AND METHOD FOR PROVIDING 3D WAFER ASSEMBLY WITH KNOWN-GOOD-DIES

(71) Applicant: Invensas Corporation, San Jose, CA (US)

(72) Inventors: Hong Shen, Palo Alto, CA (US); Liang Wang, Milpitas, CA (US); Guilian Gao, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 21 days.

(21) Appl. No.: 15/834,658

(22) Filed: Dec. 7, 2017

(65) Prior Publication Data

US 2018/0096973 A1  Apr. 5, 2018

Related U.S. Application Data

(62) Division of application No. 15/152,469, filed on May 11, 2016, now abandoned.

(Continued)

(51) Int. Cl.
*H01L 21/00* (2006.01)
*H01L 23/00* (2006.01)
(Continued)

(52) U.S. Cl.
CPC ............ *H01L 24/94* (2013.01); *H01L 21/304* (2013.01); *H01L 21/30625* (2013.01);
(Continued)

(58) Field of Classification Search
CPC ........ H01L 24/94; H01L 25/50; H01L 21/568
See application file for complete search history.

(56) References Cited

U.S. PATENT DOCUMENTS

| | | | |
|---|---|---|---|
| 7,087,502 B2 | 8/2006 | Priewasser et al. | |
| 8,841,169 B2 * | 9/2014 | Farrar | H01L 23/473 257/415 |

(Continued)

FOREIGN PATENT DOCUMENTS

KR  10-2012-0098032 A  9/2012

OTHER PUBLICATIONS

Farrens, Dr. Shari, "Wafer and Die Bonding Technologies for 3D Integration," SUSS MicroTec, Waterbury Center, VT, MRS Fall 2008 Proceeding, 2008, 11 pages.

(Continued)

*Primary Examiner* — Laura M Menz

(57) ABSTRACT

Systems and methods for providing 3D wafer assembly with known-good-dies are provided. An example method compiles an index of dies on a semiconductor wafer and removes the defective dies to provide a wafer with dies that are all operational. Defective dies on multiple wafers may be removed in parallel, and resulting wafers with all good dies stacked in 3D wafer assembly. In an implementation, the spaces left by removed defective dies may be filled at least in part with operational dies or with a fill material. Defective dies may be replaced either before or after wafer-to-wafer assembly to eliminate production of defective stacked devices, or the spaces may be left empty. A bottom device wafer may also have its defective dies removed or replaced, resulting in wafer-to-wafer assembly that provides 3D stacks with no defective dies.

14 Claims, 15 Drawing Sheets

Related U.S. Application Data

(60) Provisional application No. 62/387,502, filed on Dec. 26, 2015.

(51) Int. Cl.
| | | |
|---|---|---|
| *H01L 21/56* | (2006.01) | |
| *H01L 21/78* | (2006.01) | |
| *H01L 21/683* | (2006.01) | |
| *H01L 25/00* | (2006.01) | |
| *H01L 21/768* | (2006.01) | |
| *H01L 21/306* | (2006.01) | |
| *H01L 21/304* | (2006.01) | |
| *H01L 21/3105* | (2006.01) | |

(52) U.S. Cl.
CPC ...... *H01L 21/31051* (2013.01); *H01L 21/568* (2013.01); *H01L 21/6835* (2013.01); *H01L 21/76877* (2013.01); *H01L 21/76898* (2013.01); *H01L 21/78* (2013.01); *H01L 24/32* (2013.01); *H01L 24/83* (2013.01); *H01L 25/50* (2013.01); *H01L 2221/68327* (2013.01); *H01L 2224/32145* (2013.01); *H01L 2224/83005* (2013.01); *H01L 2224/83895* (2013.01); *H01L 2224/83896* (2013.01); *H01L 2225/06541* (2013.01); *H01L 2924/1032* (2013.01); *H01L 2924/10253* (2013.01); *H01L 2924/1205* (2013.01); *H01L 2924/1207* (2013.01); *H01L 2924/1304* (2013.01); *H01L 2924/1436* (2013.01)

(56) References Cited

U.S. PATENT DOCUMENTS

| | | | |
|---|---|---|---|
| 8,872,324 B2* | 10/2014 | Farrar | H01L 23/3121 |
| | | | 257/687 |
| 9,222,983 B2 | 12/2015 | Goel | |
| 9,431,375 B2 | 8/2016 | Defretin et al. | |
| 2009/0130821 A1* | 5/2009 | Cox | H01L 23/544 |
| | | | 438/455 |
| 2012/0315710 A1* | 12/2012 | Hozawa | H01L 21/6835 |
| | | | 438/5 |
| 2013/0288433 A1* | 10/2013 | Farrar | H01L 23/473 |
| | | | 438/113 |
| 2015/0082108 A1* | 3/2015 | Goel | G01R 31/31851 |
| | | | 714/726 |
| 2015/0130040 A1* | 5/2015 | Defretin | H01L 23/10 |
| | | | 257/686 |
| 2017/0186730 A1* | 6/2017 | Shen | H01L 21/568 |
| 2018/0096973 A1* | 4/2018 | Shen | H01L 21/568 |

OTHER PUBLICATIONS

International Search Report and Written Opinion dated Mar. 17, 2017 for PCT Application No. PCT/US2016/064955, 16 pages.

\* cited by examiner

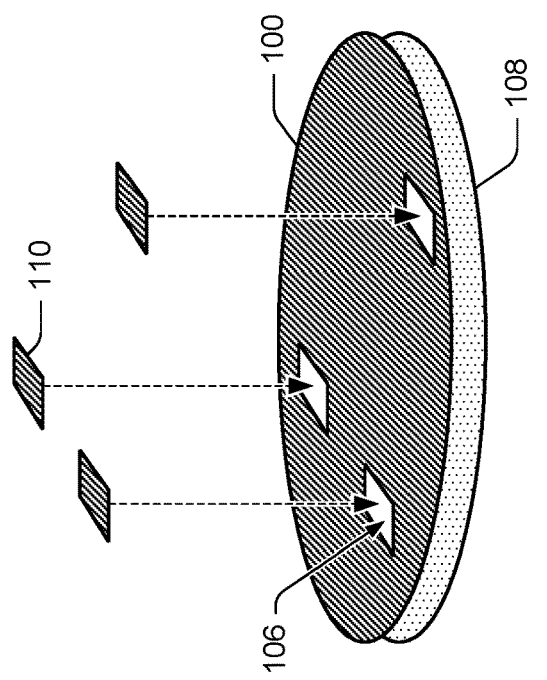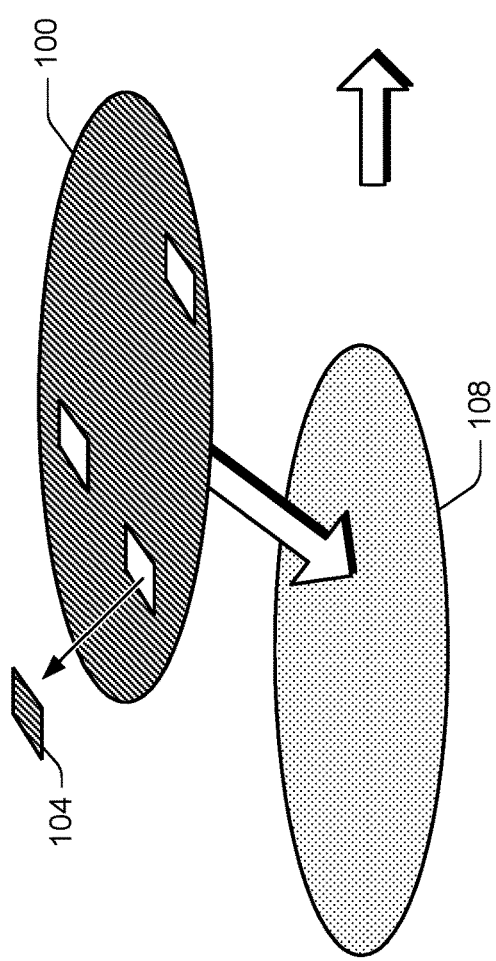
FIG. 2

SYSTEM AND METHOD FOR PROVIDING 3D WAFER ASSEMBLY WITH KNOWN-GOOD-DIES

RELATED APPLICATIONS

This divisional patent application claims the benefit of priority to U.S. patent application Ser. No. 15/152,469 to Shen et al., filed May 11, 2016, which in turn claims priority to U.S. Provisional Patent Application No. 62/387,502 to Shen et al., filed Dec. 26, 2015, both of these incorporated herein by reference in their entireties.

BACKGROUND

High volume manufacture of DRAM stack memory can be afflicted with defects and dropouts in some of the individual dies making up a population of dies on a wafer. The defective dies ("bad dies") create a two-pronged complication: a need to spend resources on detecting which dies are defective, and a need to commit resources to working-around the defective dies with minimum decrease in productivity.

Conventionally, a semiconductive wafer may be bonded to another wafer ("wafer-to-wafer" or "W2W") to make or initiate 3D stack construction of integrated circuit devices. Wafer bonding is a packaging technology on the wafer-level for fabrication of microelectronics. "Microelectronics," as used herein, denotes electronics packages, integrated circuit packages, such as 3D stacked integrated circuit devices, and also includes microelectromechanical systems (MEMS), nanoelectromechanical systems (NEMS), and optoelectronics. If there are bad dies on one or more wafers used in the wafer-level assembly, then all of the resulting 3D stacks which contain a bad die from any of the wafers, will in turn be defective.

Conventionally, in a manufacture process, instead of proceeding with a population of dies on a single wafer, the semiconductive wafer may also be singulated into individual dies, the bad dies discarded, and the good dies individually assembled into good packages by bonding them to the next die in the stack. However, this process necessitates handling each die individually to make each stack.

Conventionally, die-to-wafer bonding (D2W) processes may have throughput concerns, due to obstacles of surface cleanliness, alignment, pick & placement precision, and so forth. Also, conventionally reconstituted wafers may have die-shift concerns and may require extra steps in making temporary bonds and then debonding them.

SUMMARY

This disclosure describes systems and methods for providing 3D wafer assembly with known-good-dies. An example method compiles an index of dies on a semiconductor wafer and removes the defective dies to provide a wafer with all good dies. Defective dies on multiple wafers may be removed in parallel, and resulting wafers with all good dies stacked in 3D wafer assembly. In an implementation, the spaces left by removed defective dies may be filled with good dies or other materials, of may be left empty. Defective dies may be replaced either before or after wafer-to-wafer assembly to eliminate production of defective stacked devices. A bottom device wafer may also have its defective dies removed or replaced, resulting in wafer-to-wafer assembly that provides 3D stacks with no defective dies.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

FIG. 2 is a diagram of an example patch-window technique for performing wafer-to-wafer assembly of 3D stacks while individually replacing bad dies with known-good-dies.

DETAILED DESCRIPTION

Overview

This disclosure describes systems and methods for providing 3D wafer assembly with known-good-dies, also referred to herein as "good dies" or "operational dies." Assembly of DRAM (memory) stacks during high volume manufacturing may be plagued with some defective dies or at least some dies that are not verified as acceptable ("bad dies"), resulting in a cascade of defective 3D IC end products.

Figure 1:
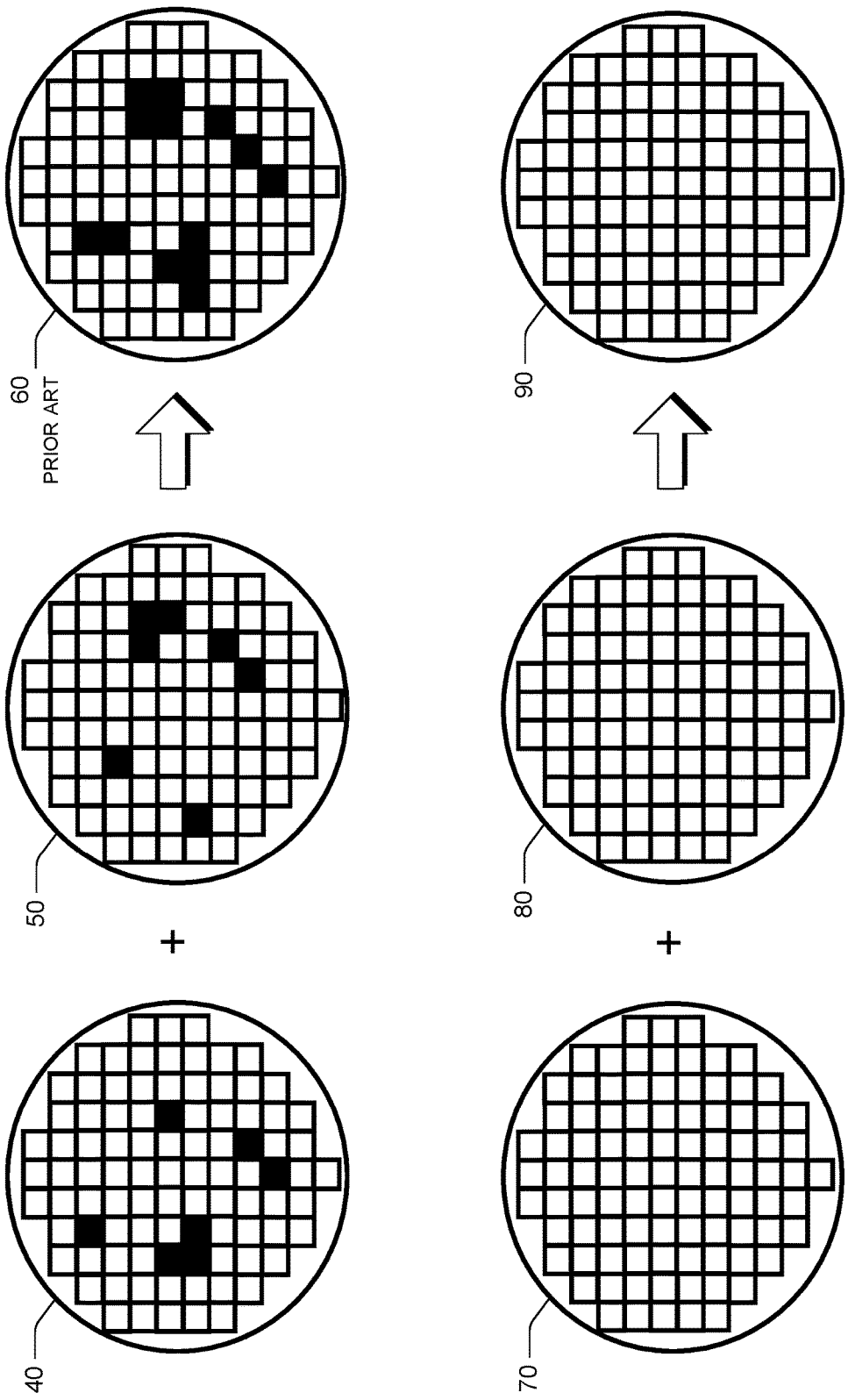
FIG. 1 is a diagram of a conventional wafer-to-wafer stack with defective dies versus an example wafer-to-wafer stack with no defective dies, manufactured by a described method.

FIG. 1 shows a conventional semiconductor wafer 40, to be used as a bottom device wafer. The conventional semiconductor wafer 40 includes seven defective, inoperable, or undesirable (hereinafter "bad") dies within its batch of dies on the wafer surface. A second conventional wafer 50 also includes seven different bad dies within its own respective batch of dies. Conventionally, a wafer-to-wafer bonding technique between the first wafer 40 and the second wafer 50 during stack assembly yields a conventional wafer stack 60 that now includes up to 14 bad stacks based on the original seven bad dies of the first wafer 40 and the seven bad dies of the second wafer 50.

The systems and methods for providing 3D wafer assembly with known-good-dies, as described herein, can eliminate the bad dies in a first example wafer 70 or replace the bad dies with known-good-dies in order to begin the wafer-to-wafer process with a bottom device wafer that has no defective dies. A second example wafer 80 may also have its bad dies eliminated, or replaced with known-good-dies. In an implementation, the first wafer 70, including empty sites where the bad dies were removed, is bonded to the second wafer 80 in a wafer-to-wafer bonding operation. The empty spaces where the bad dies were removed are either left empty, filled at least in part with a fill material, or filled at least in part with known-good-dies placed and bonded into some or all of the empty sites. When the removed bad dies are replaced with known-good-dies, then the result is a wafer stack 90 that has no bad stacks on account of bad dies, as compared with the thirteen bad stacks in the conventional wafer stack 60 resulting from conventional techniques.

Example Manufacturing Techniques

An example process described herein compiles a map or index of dies, such as defective or undesirable dies (or an index of good dies, or both) on the semiconductor wafer, and utilizes the wafer in a wafer-to-wafer assembly of stacked devices, replacing some or all of the defective dies either before or after the wafer-to-wafer assembly, to eliminate production of defective stacked devices. In an implementation, an example process removes the bad dies from the wafer leaving empty sites, or windows, where the bad dies have been removed, but preserves the remaining good dies on the wafer. The wafer, with empty sites, may then be bonded to another wafer using a wafer-to-wafer bonding technique, which enables 3D assembly of the good dies remaining on the single wafer in a wafer-to-wafer bonding step, as opposed to individuating and working with assembly of individual packages using D2D bonding. If desirable, the empty sites on the initial wafer can then be filled in part or in whole with known-good-dies, using die-to-wafer (D2W) bonding techniques. Or, some or all of the empty sites may be left empty during further processing. The net result is that good dies remain on the wafer and effectively receive wafer-to-wafer bonding, while the bad dies can be replaced individually, or in groups, if desired, through die-to-wafer bonding bonding. This process provides reliable large-scale 3D wafer assembly manufacture with only known-good dies on the wafer, even if some sites on the wafer are intentionally left empty. The example systems and methods can be used with many different processes in which the known-good-dies issue arises, and are not limited to particular processes or bonding techniques.

The example systems and methods are applicable to manufacture of DRAM stacks, such as those employing DBI (DIRECT BOND INTERCONNECT) techniques (Ziptronix Inc., Raleigh, N.C. and Tessera Technologies Inc., San Jose, Calif.). But the example systems and methods are not limited to manufacture of DRAM stacks, and are not limited to particular back-end-of-line processes or particular bonding or interconnect techniques, such as direct-bond-interconnect (DBI). The example systems and methods for providing 3D wafer assembly with known-good-dies can be applied to numerous manufacturing processes in which the known-good-die problem arises.

Back-end-of-line processes, as the term is used herein, include the second part of integrated circuit fabrication in which individual devices, such as transistors, capacitors, resistors, and so forth, are interconnected with wiring on the wafer. The back-end-of-line segment of fabrication usually starts when a first layer of a metal is deposited on the wafer. Back-end-of-line materials include contacts, insulating layers (dielectrics), metal layers at different levels, and bonding sites for chip-to-package connections.

In microelectronics, in an example application of the example methods, a three-dimensional integrated circuit (3D IC) is an integrated circuit manufactured by stacking silicon wafers and/or dies and interconnecting them vertically using through-silicon vias (TSVs), for example, so that the stacked wafer and/or dies behave as a single device to achieve performance improvements at reduced power and smaller footprint than conventional two-dimensional circuits. 3D IC, as the term is used herein, is just one of a host of 3D integration schemes that exploit the "z-direction," or third dimension of height/depth, to achieve electrical performance benefits. Various 3D IC schemes can be classified by their level of interconnect hierarchy at the global (package), intermediate (bond pad), and local (transistor) level. In general, 3D integration is a broad term that includes such technologies as 3D wafer-level packaging (3DWLP); 2.5D, and 3D interposer-based integration; 3D stacked IC (3D-SIC) manufacture, monolithic 3D IC manufacture; 3D heterogeneous integration; and 3D systems integration.

Direct-bond-interconnect (DBI), as one example bonding technique, includes processes that enable semiconductor substrates, such as silicon and III-V combinations to be bonded and electrically interconnected in a 3D manner to maximize density of signal paths. Direct-bond-interconnect (DBI) enables an ultra-high density of vertical interconnections to be made between transistors, gates, and devices in order to build scalable 3D ICs.

Example direct-bond-interconnect (DBI) techniques can decrease the need for through-silicon-vias and TDVs (through-die-vias) by offering solutions where interconnect occurs at the bonded surface. Conventional through-silicon-via technologies used in current 3D IC integration methods can disrupt back-end-of-line interconnect routing, consume excessive silicon, and hinder qualification. Direct-bond-interconnect (DBI) provides high density of electrical connections for 3D ICs bonded in die-to-wafer or wafer-to-wafer scale methodology without etching and filling of vias through back-end-of-line interconnect. For example, direct-bond-interconnect (DBI) can achieve over 100,000,000 electrical connections per square centimeter compared to a 100,000 connections per square centimeter density with through-die-vias used in conventional 3D interconnect approaches.

Example, direct-bond-interconnect (DBI) techniques allow for direct connections to be made between ICs as part of the bond process without disrupting and compromising the interconnect stack. Direct-bond-interconnect (DBI) techniques can enable covalent, room temperature bonds to be made between the silicon oxide surfaces or the nitride surfaces of each chip used in the 3D stacked structure, and may utilize a chemo-mechanical polish to expose metal patterns embedded in the surface of each chip. When these patterns are aligned and bonded, distortion and misalignment are minimized, as opposed to other bonding techniques that require heat and/or pressure as part of the bonding process, increasing distortion and misalignment. The direct bond is characterized by very high bond energy between the chip surfaces, including the metal patterns, which form effective electrical connections between the chips. The low resistance of these electrical connections enables better power efficiency and reduces the overall power consumption of the 3D IC to be formed.

The systems and methods for providing 3D wafer assembly with known-good-dies described herein can use face-to-face wafer bonding including, for example, copper thermocompression or direct-bond-interconnect (DBI) techniques as described above.

The example systems and methods may utilize bonding of silicon wafers, a key enabling technology for nanotechnology, micromachining, and 3D electronics. A variety of techniques have been developed, including adhesive bonding, metal eutectic bonding, and bonding based on the silicon oxide surface either grown or deposited on a wafer. Oxide bonding has the advantages of being mechanically robust, chemically inert, and capable of withstanding the high temperatures typical of silicon processing. The direct oxide bond is formed by bringing together silicon wafers which have been planarized and chemically treated to form a strong bond at low temperature. When the wafers are brought together at room temperature, a strong bond spontaneously initiates. Further annealing can provide a substantial increase in bond strength. The direct-bond-interconnect (DBI) can utilize a planarized hybrid metal and oxide surface. Examples of metal include nickel or copper. The metal in the planarized hybrid surface forms an interconnect across the bond interface, which can be used to build 3D interconnect structures. The process works best with good planarity, which is a feature of modern CMOS processes. Dust particles present during the bonding process can produce local bond voids. These unbonded areas limit the large area module yield and motivate active tile development. The example direct-bond-interconnect (DBI) process, introduced above, can be used for wafer-to-wafer or chip-to-wafer bonding. However the wafer-to-wafer process is least expensive and most well suited to scaling to large volumes.

The example systems and methods for providing 3D wafer assembly with known-good-dies provide many advantages over alternative conventional approaches. For example, conventional die-to-wafer bonding, (D2W) thick die planarization can be characterized by low throughput and warpage due to the coefficient of thermal expansion (CTE) mismatch between gap-fill materials and silicon. The example systems and methods for providing 3D wafer assembly with known-good-dies can provide up to a ten-fold increase in throughput, assuming a 90% yield on the wafer, and substantially reduces the warpage problems by minimizing gap-fill material volume.

Conventional thin die-to-wafer bonding techniques are also characterized by low throughput and the problems of thin die handling. In contrast, the example systems and methods for providing 3D wafer assembly with known-good-dies again provides up to a ten-fold increase in throughput, and also the benefit of not having to handle thin dies.

Conventional reconstituted die-to-wafer bonding and wafer-to-wafer techniques have the drawbacks of die shift, warpage due to the CTE mismatch between the gap-fill materials and silicon, and also adhesion of oxides over the gap-fill materials. The example systems and methods for providing 3D wafer assembly with known-good-dies provides no die shift for the majority of dies and minimum die shift for replaced dies. In addition, there is no temporary bonding and debonding to burden the processing. There is substantially reduced warpage because the gap-fill material volume is minimized. And there are fewer adhesion problems because the gap-fill material coverage is minimized.

In an implementation, an example process includes separate bonding steps for good dies and bad dies: wafer-to-wafer bonding for good dies, and die-to-wafer bonding for bad dies. The bad dies may be removed by dicing, by a laser full-cut or partial cut dicer, for example, from the semiconductor wafer. The wafer, with bad dies removed forming through holes, may be wafer-to-wafer bonded onto an existing wafer, carrier, or an existing device wafer stack.

The example systems and methods may be applied to assembly in several fields, such as DRAM for mobile devices, enterprise devices, datacenter equipment, high-performance computing devices, and PCs. The example systems and methods improve upon conventional thin wafer, wafer/die handling, and thick die-to-wafer planarization solutions.

The example systems and methods provide a high-throughput wafer level process with bad die replacement to maintain high yield. Example methods can include high-throughput die-to-wafer bonding, including aligning only once, and a pick-and-place operation for all replacement dies, using the wafer index. In an implementation, there is no temporary bond/debonding stage to slow operations, and no die shift.

Example Systems

FIG. 2 shows an example implementation of a process for providing 3D wafer assemblies with known-good-dies. Instead of a conventional process of singulating a wafer into individual dies, discarding the bad dies, and assembling good stacks from only the good dies, the example process keeps all the good dies in wafer form 100, but removes the bad dies 104, leaving empty sites 106 in the wafer 100. In an implementation, the example method then bonds the wafer 100 to a second wafer 108. Then, in a patch-window step, the example method bonds known-good-dies 110, or groups of known-good-dies 110, or another filler material, as desired, to at least some of the empty sites 106 in the wafer 100, or else leaves the empty sites 106 empty. This process results in a wafer 100 to be used in wafer-to-wafer assembly that has all good dies 110, even if some sites 106 are empty. When the second wafer 108 also has its defective dies removed, and its empty sites replaced in whole or in part with good dies 110, then the example process results in wafer-to-wafer assembly with all good dies, and an enhanced number of good stacks.

Figure 3:
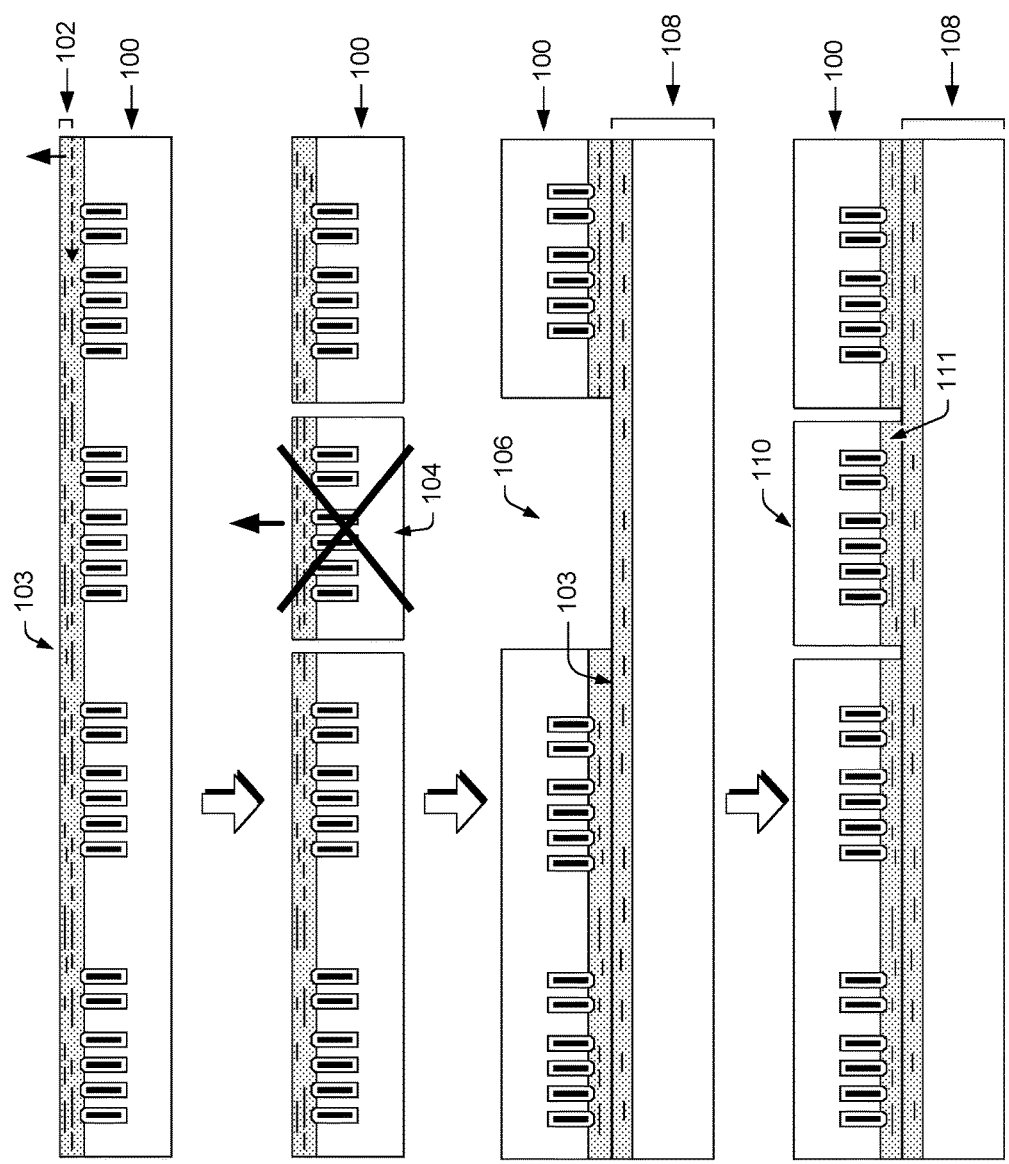
FIGS. 3-4 are diagrams of an example process for removing bad dies during a wafer-to-wafer assembly.
Figure 4:
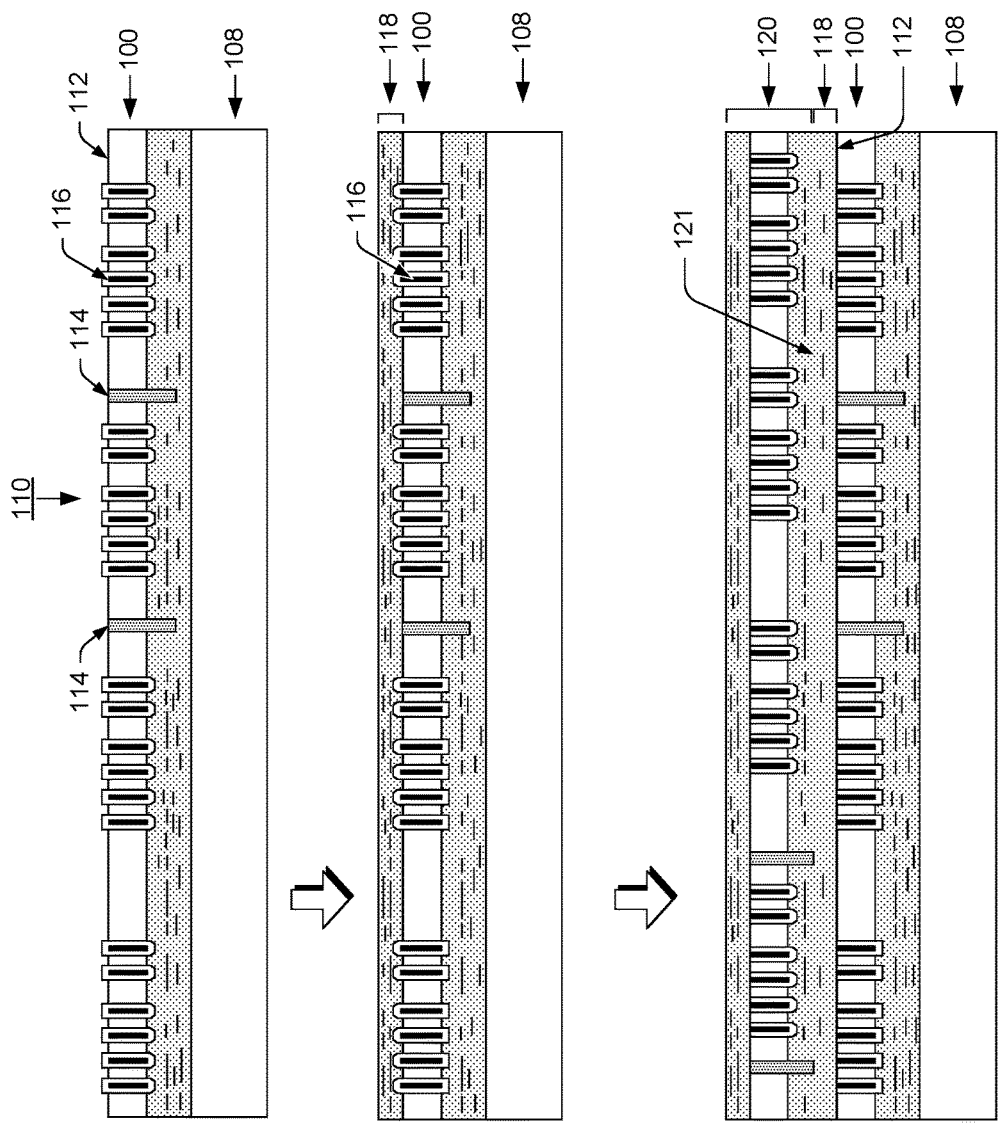

FIGS. 3-4 show an example implementation of the systems and methods for providing 3D wafer assembly with known-good-dies, with respect to two semiconductor wafers to be stacked. FIG. 3 shows an example wafer 100 after at least one back-end-of-line stage, for example, after application of at least one dielectric layer and at least one conductive layer to the wafer 100. A "conductive layer" is a layer that contains conductors, conductive lines, traces, circuits, or the like. The back-end-of-line stage may implement a direct-bond-interconnect (DBI) operation, for example, and addition of through-silicon-vias (TSVs), for example. The example process is not limited to direct-bond-interconnect (DBI) implementations, however.

In an implementation, thinning 102, such as grinding or polishing, for example, is applied to a layer of a front side 103 of the wafer 100 to reduce wafer thickness: to 200 μm, for example. Defective ("bad") dies 104 are removed by dicing, such as laser dicing, plasma etching, water jet cutting, chemical etching, and so forth, of the bad dies 104 from the wafer 100, leaving empty sites 106, or through-holes 106 in the wafer 100. Dicing may employ a laser full-cut dicer from DISCO technologies, Tokyo, Japan, for example. Or, plasma etching may utilize stepper photolithography, indexing from a known-good-dies map, for example.

The front side 103 of the wafer 100, with the through-holes 106 where the bad dies 104 have been removed, may be bonded to a second, bottom device wafer 108. One or more known-good-dies 110, including applied layers 111, or else a filler material (not shown), may be bonded to the bottom device wafer 108 at some or all of the empty sites 106 in the wafer 100, or the empty sites 106 may be left empty. In an implementation, the good dies 110 may be obtained from another wafer being prepared at the same time in a parallel process. If good dies 110 are being placed, instead of using a filler material or just leaving the empty sites 106 empty, then a pick-and-place operation, for example, may be used. Depending on the specific die replacement process, the bonds of the replaced known-good-dies 110 to the bottom device wafer 108 may then be annealed.

In FIG. 4, in a backside reveal, the backside 112 of the wafer 100 may be thinned, for example to approximately 50 μm, and a filler material, such as an insulator, a dielectric, an oxide, a molding material, or a BCB material may be deposited to fill gaps or grooves 114 around the newly bonded good dies 110. Thinning, polishing, grinding, polygrinding, etc., may be applied to reveal through-silicon-vias 116.

After the through-silicon-vias 116 are revealed, continued backside processing may apply one or more additional layers, such as an oxide deposition 118 at high temperature for high quality, for example, as well as apply polishing, chemical-mechanical planarization (CMP), back-end-of-line procedures, and/or a direct-bond-interconnect (DBI) layer, for example.

More layers 120 may be bonded onto the stack, by facing the front 121 of the added wafer layers 120 to the backside 112 (& layer 118) of the wafer 100, using the same processes as above.

Figure 5:
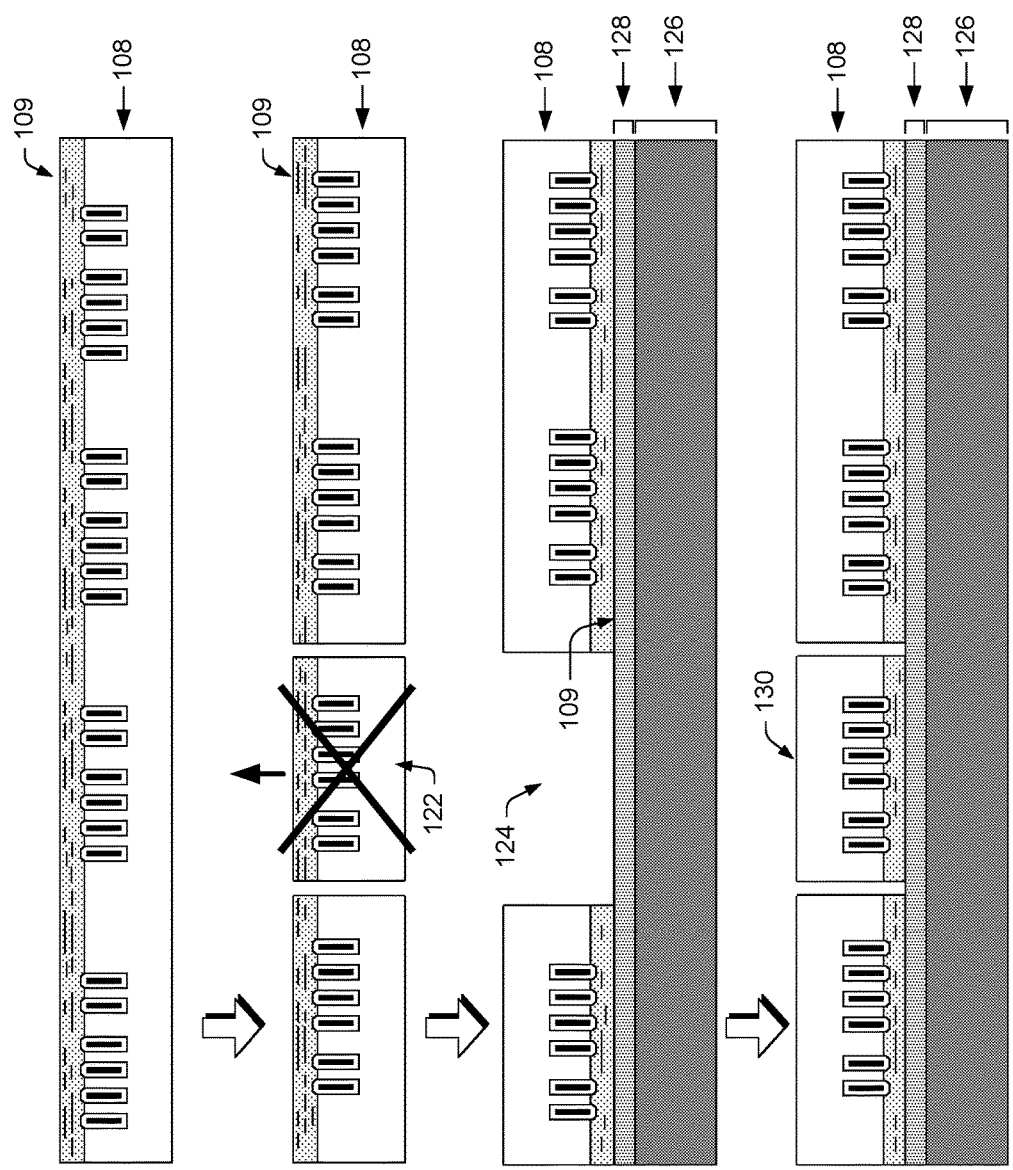
FIGS. 5-6 are diagrams of an example process for making a bottom device wafer for a wafer stack with bad dies removed.
Figure 6:
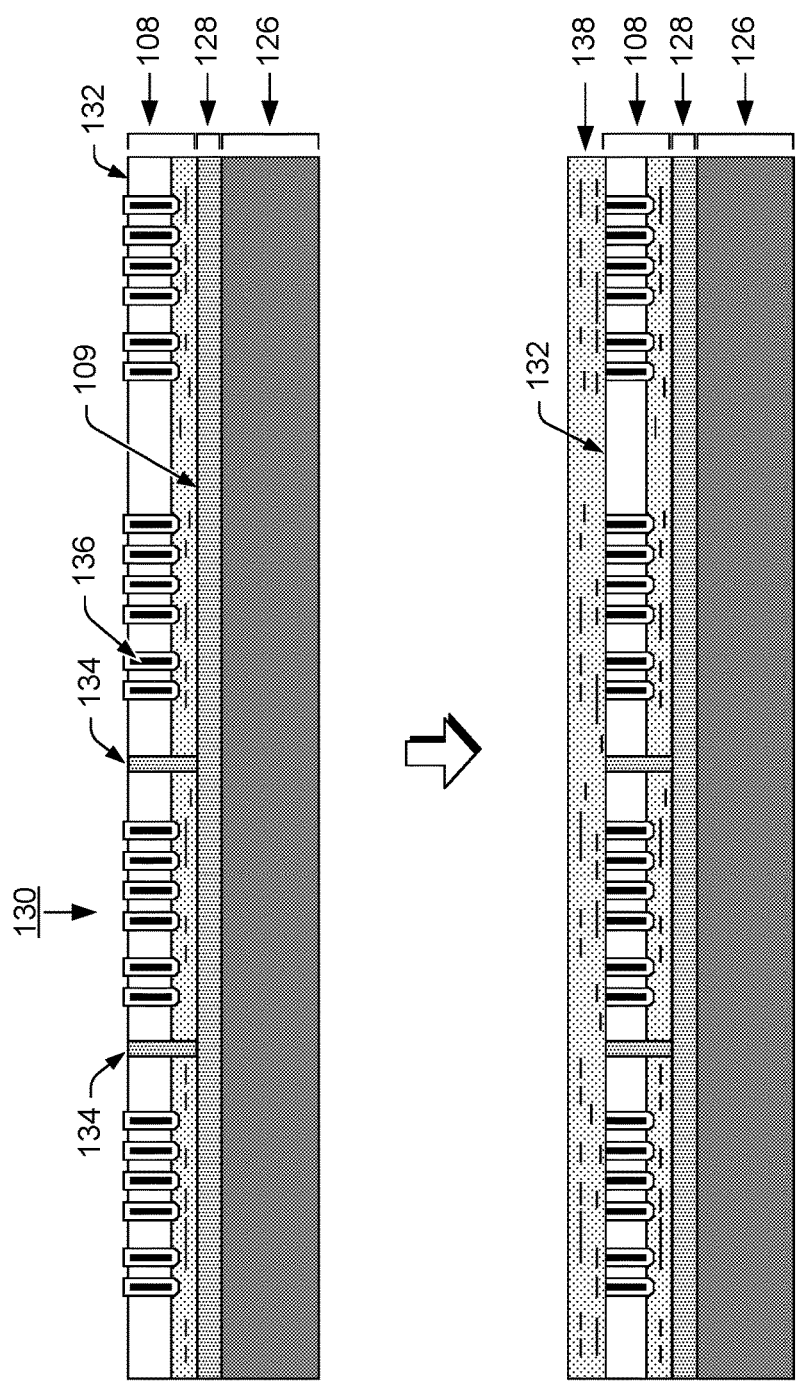

FIGS. 5-6 show example production of a bottom device wafer 108, for use in wafer-to-wafer processes such as that just described above. The production of the bottom device wafer 108 may include back-end-of-line/direct-bond-interconnect (DBI)/and through-silicon-via operations, with thinning to 200 μm, for example, among other operations.

For preparation of an example bottom device wafer 108, one or more bad dies 122 may be removed by dicing, such as laser dicing, plasma etching, water jet cutting, chemical etching, for example, leaving empty sites 124, or through-holes, in the bottom device wafer 108.

The front side 109 of the bottom device wafer 108, with empty sites 124 can be bonded to a temporary carrier 126 through a bond layer 128, using silicon nitride $Si_3N_4$/silicon dioxide $SiO_2$/silicon Si, for example. Later, grinding can be used to remove the carrier 126, or, the bottom device wafer 108 can be removed via photo, heat, or knife techniques from a temporary bond with the carrier 126.

Known-good-dies 130 may be bonded to the bottom device wafer 108 at some or all of the empty sites 124 in the wafer 108, applying a pick-and place operation, for example.

In FIG. 6, the backside 132 may be thinned, to approximately 50 μm for example, and a filler, such as an insulator, a dielectric, an oxide, a molding material, or a BCB material, for example, may be deposited to fill the gaps or grooves 134 around the newly placed good die 130. Grinding, polishing, and so forth may be applied to the backside 132 to reveal through-silicon-vias 136 that may be present.

After the through-silicon-via reveal, continued backside processing may include application of additional layers, such as deposition of an oxide layer 138, for example, and other operations such as polishing or planarization, chemical-mechanical planarization, back-end-of-line procedures, and/or formation of a direct-bond-interconnect (DBI) layer, for example.

After an entire stack is assembled, the temporary carrier 126 and bond layer 128 can be removed.

Figure 7:
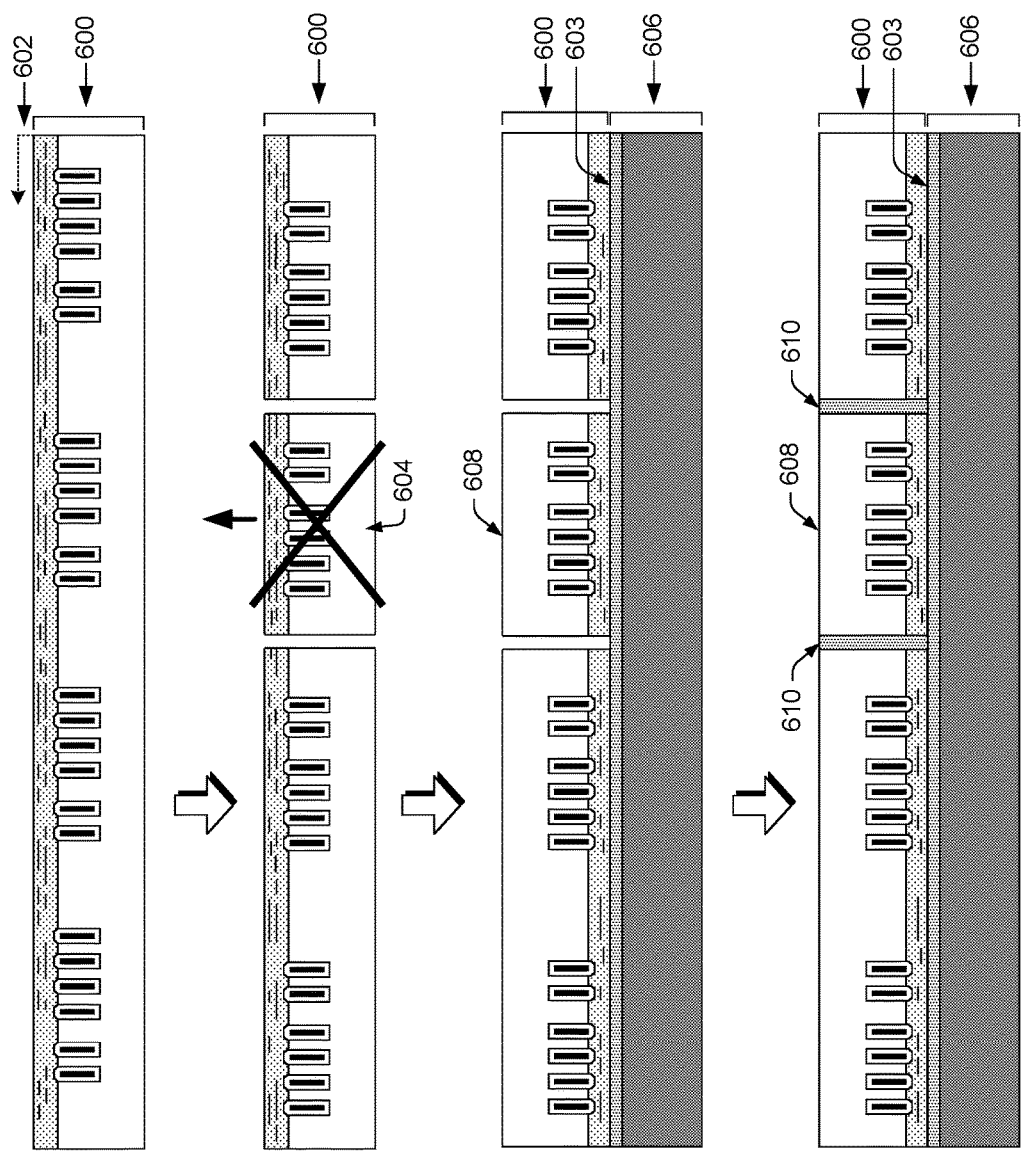
FIGS. 7-8 are diagrams of an example process of stacking multiple wafer layers that have been made in parallel, including removal of bad dies.
Figure 8:
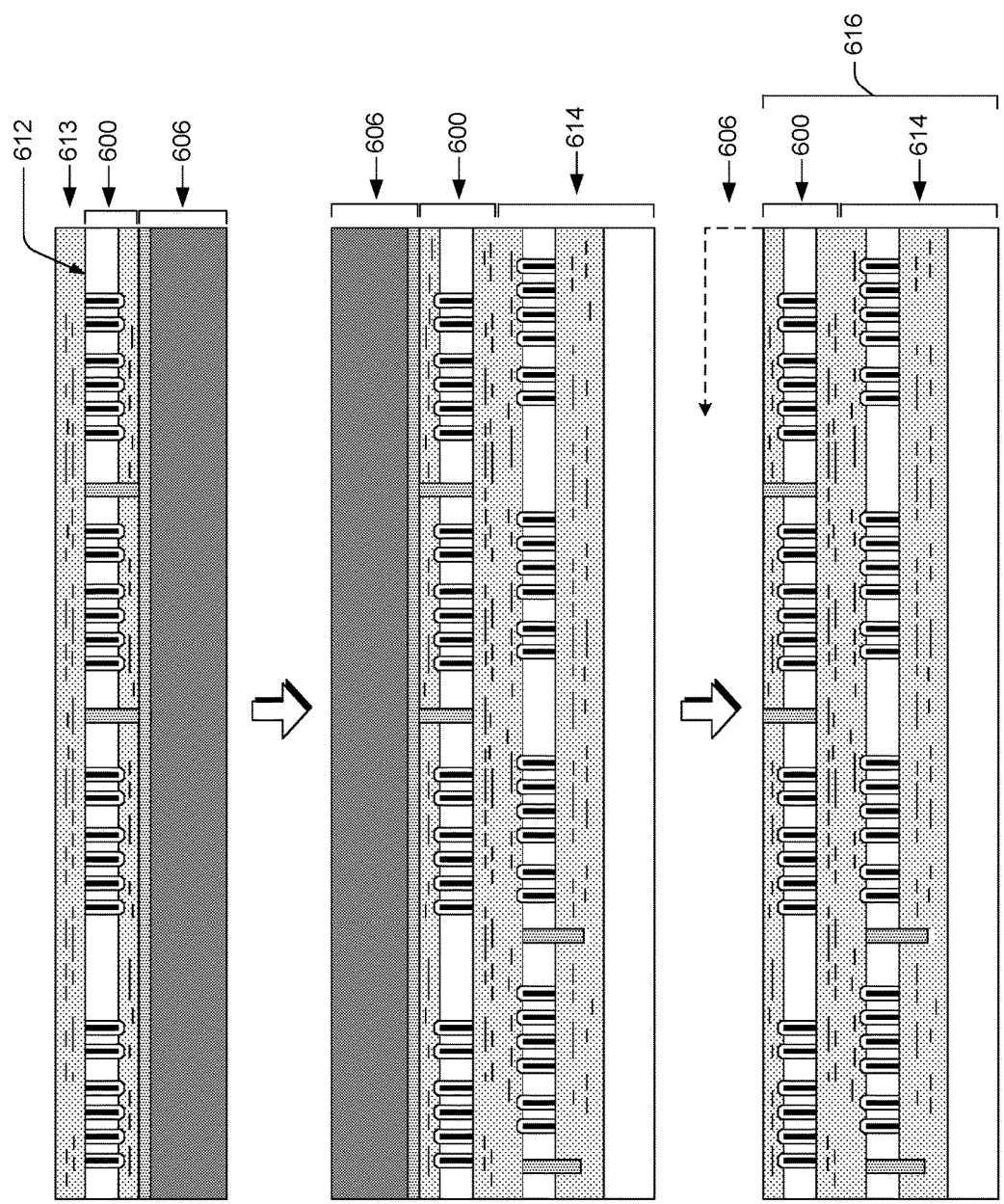

FIGS. 7-8 show an example method of stacking the multiple wafer layers of a wafer stack, with defective dies removed. The wafer layers can be manufactured in parallel, each wafer layer of the stack being manufactured simultaneously on a single wafer or multiple wafers 600, and then stacked.

First, a representative wafer 600 may be thinned 602 by polishing or grinding front-side layers of the wafer 600. The thinning 602 may reduce the wafer thickness to around 200 μm, for example, to allow for stacking and high density packaging of integrated circuits. Then, only bad dies 604 are removed from the wafer 600 by various techniques, such as dicing, which may include laser dicing, plasma etching, ablation, water jet cutting, chemical etching, and laser grooving. The removal of the defective dies 604 leaves empty spaces ("empty sites") in the wafer 600.

Next, the front side 603 of the wafer 600 may be mounted on a rigid temporary carrier 606. In three different variations, the empty sites may be left empty, may be filled at least in part with a fill material, or may host good replacement dies substituting for the defective dies 604 that have been removed. If known-good-dies 608 are used to replace the removed defective dies 604, then the good dies 608 may be placed in some or all of the empty sites, using the wafer fiducial for alignment, for example. The resulting gaps or grooves 610 around the newly placed good dies 608 may be filled with a fill material, such as an insulation, a dielectric, a molding material, an oxide, and a benzocyclobutene (BCB)-based material, and so forth, and forwarded for further downstream processing.

In FIG. 8, processing on the backside 612 of the wafer 600, may include thinning of the backside 612, and placement or formation of extra layers 613, such as one or more layers of dielectric, and one or more adjacent conducive layers in electrical communication with the through-silicon-vias, the layers polished or planarized as suitable. For example, the extra layers 613 may include layers of ZIBOND direct oxide bonding, or layers of direct-bond-interconnect (DBI) non-adhesive covalent bonding with integrated high-density interconnect formation (Ziptronix Inc., Raleigh, N.C. and Tessera Technologies Inc., San Jose, Calif.). Next, wafer-to-wafer bonding 614 may commence. Finally, or at some stage, the temporary carrier 606 may be debonded. The result is a multi-layer wafer assembly 616 composed of initial wafer 600 and its layers and additional wafer layers 614. The wafer-to-wafer stack assembly may be repeated, or course, to increase the depth and density of the stack.

Figure 9:
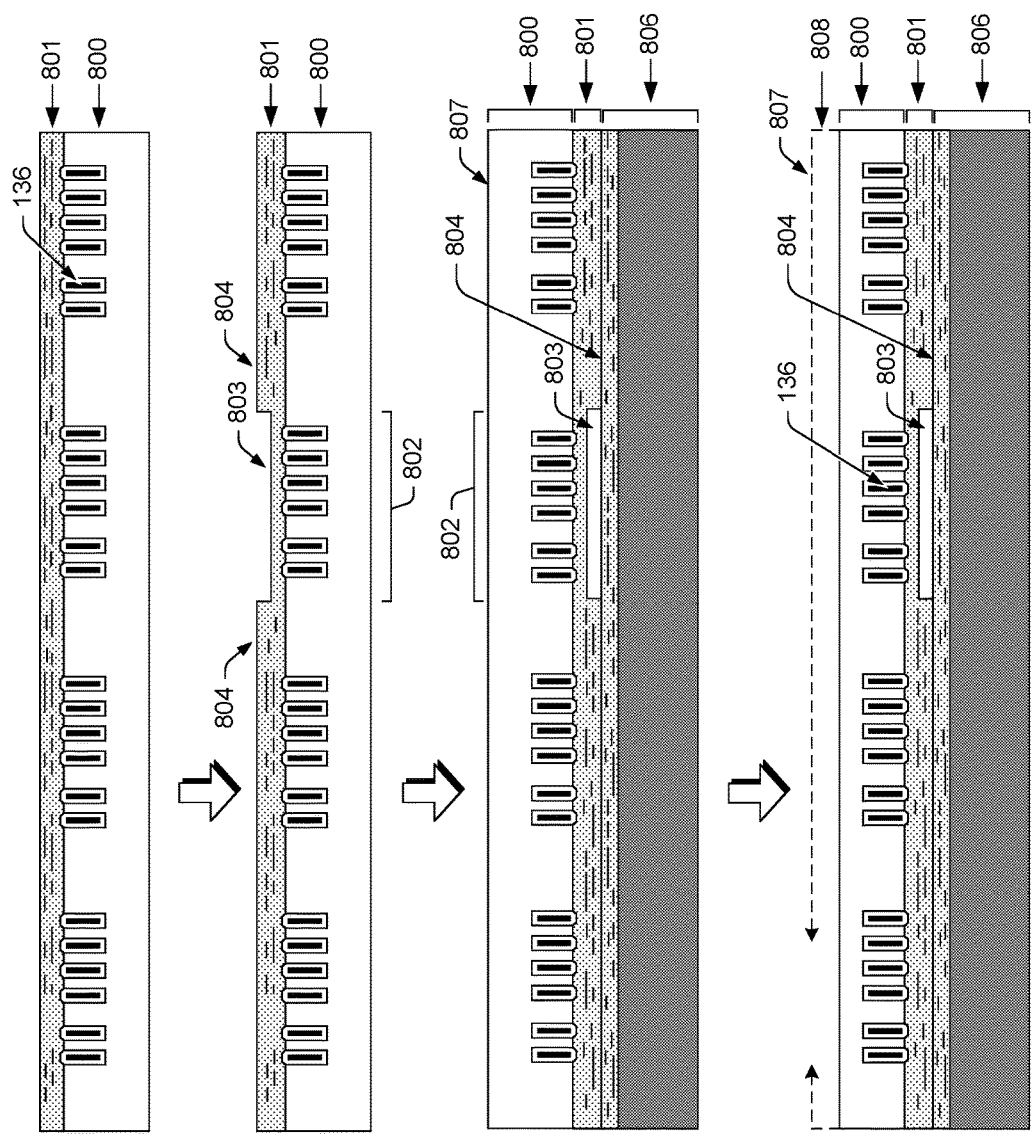
FIGS. 9-10 are diagrams of an example process of disabling bad dies before a wafer-to-wafer bonding process, for removal after the wafer-to-wafer process.
Figure 10:
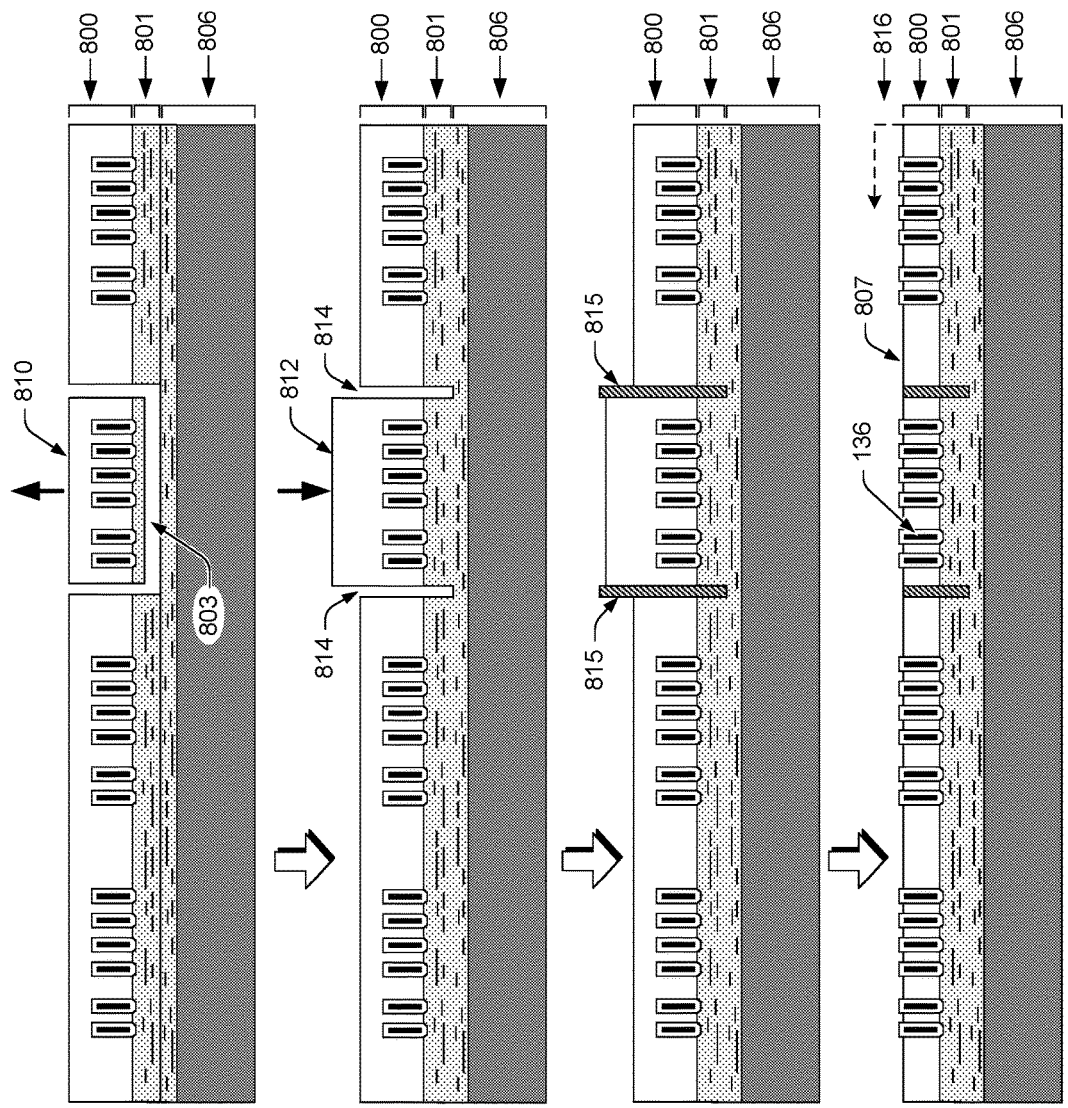

FIGS. 9-10 show an example process of disabling bad dies before a wafer-to-wafer bonding process, for removal after the wafer-to-wafer process. In the example process, some or all of the defective dies are removed after the wafer-to-wafer bonding process, instead of before the wafer-to-wafer bonding process as previously shown, for example, in the example implementations of FIGS. 3-6 above.

In FIG. 9, at full thickness, an example wafer 800 may have through-silicon-vias 136, and one or more back-end-of-line layers 801, such as one or more dielectric layers and one or more conductive layers, in electrical communication with the through-silicon-vias. The layers 801 may be direct-bond-interconnect (DBI) layers, for example. Before wafer-to-wafer bonding, each defective die 802 is effectively disabled from the wafer-to-wafer bonding process by removing a thin-layered area 803 from the layers 801 on the front side 804 of the wafer 800, but only at each site of the defective die 802. The thin-layered area 803 may be removed, or disabled from bonding, by laser ablation or etching, for example.

The front side 804 of the wafer 800 is then bonded to a bottom device wafer 806. The preparation of a suitable bottom device wafer 806 is described above, with respect to FIGS. 5-6. The backside 807 of the wafer 800 may then be thinned 808 to reduce thickness, but in an implementation, not so thin as to expose the through-silicon-vias 136.

In a next stage of the example process, as shown in FIG. 10, only the defective dies 810 are removed, by cutting vertical grooves 814, for example by laser cutting (partial) or plasma etching, to release the designated defective dies 810 from the wafer 800. Each empty site thereby created on the wafer 800 may be left empty, may receive a fill material, or may receive an operational, known-good-die 812, bonded to the bottom device wafer 806, and the bond then annealed, for example.

Vertical gaps or grooves 814 left around newly placed known-good-dies 812 may be filled with a fill material 815, such as an insulator, a dielectric, an oxide, a molding material, a BCB material, or some other polymer, for example. The fill material 815 may be a material that starts as liquid, for example, and is then cured to be compatible with a chemical-mechanical polishing (CMP) process.

The backside 807 of the wafer 800 may then be thinned and a polishing or polygrind operation 816 applied to reveal through-silicon-vias 136. At this point the wafer 800, now populated with known-good-dies 812 may undergo stacking of multiple layers and parallel manufacturing, as described in relation to FIGS. 7-8 above, for example.

Figure 11:
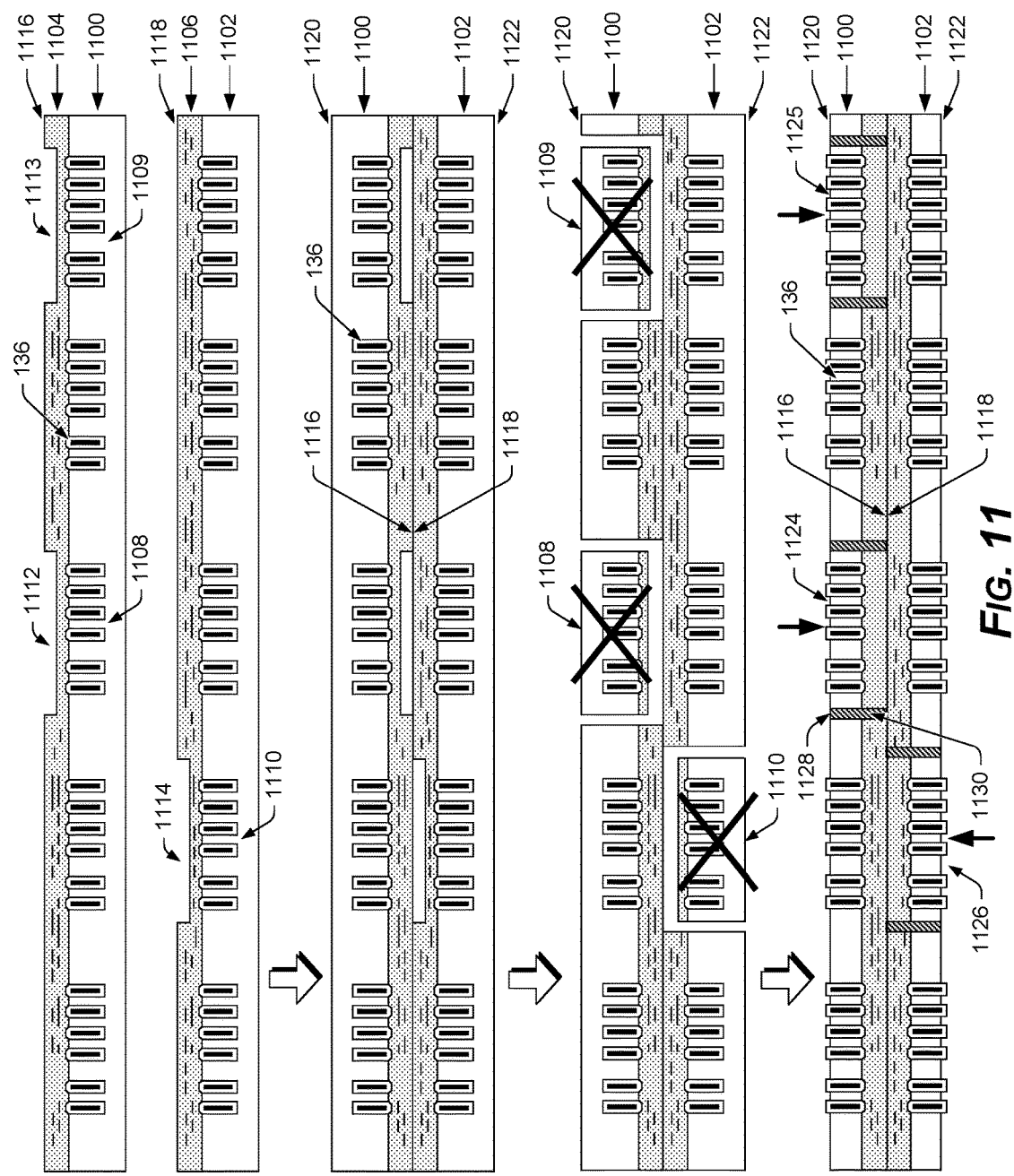
FIG. 11 is a diagram of an example process of removing bad dies from both sides of two wafers that have been bonded to each other.

FIG. 11 shows a variation of the example process shown in FIGS. 9-10, of disabling a bonding surface of bad dies before a wafer-to-wafer bonding process, for removal of the bad dies after the wafer-to-wafer process. In FIG. 11, two full thickness example wafers 1100 & 1102 may have through-silicon-vias 136, and one or more (back-end-of-line) layers 1104 & 1106, such as one or more dielectric layers and one or more conductive layers. Before wafer-to-wafer bonding, defective dies 1108 & 1109 & 1110 are effectively designated to be disabled from the wafer-to-wafer bonding process by removing thin-layered areas 1112 & 1113 & 1114 from the layers 1104 & 1106 of the respective front sides 1116 & 1118 of the respective wafers 1100 & 1102, but only at the sites of the defective dies 1108 &1109 & 1110. The thin-layered areas 1112 & 1113 & 1114 may be removed or disabled from bonding by laser ablation or etching, for example.

In a next step, the front sides 1116 & 1118 of the wafers 1100 & 1102 are then bonded to each other, instead of being bonded to respective bottom device wafers, as in FIGS. 9-10. Backsides 1120 & 1122 of the respective wafers 1100 & 1102 may then be thinned to reduce thickness, but in an implementation, not so thin as to expose through-silicon-vias 136.

In a next stage of the example process, only the defective dies 1108 & 1109 & 1110 are removed from the respective backsides 1120 & 1122 of the respective wafers 1100 & 1102, according to a respective index or map of the dies on each wafer 1100 & 1102. The defective dies 1108 & 1109 & 1110 may be at different relative positions for each respective wafer 1100 & 1102. The defective dies 1108 & 1109 & 1110 on each respective backside 1120 & 1122 may be removed via dicing, such as laser cutting or plasma etching, for example, for their removal. Each empty site thereby created on the respective wafers 1100 & 1102 may be left empty, may receive a fill material, or may receive operational, known-good-dies 1124 & 1125 & 1126, bonded to the front side 1116 or 1118 of the opposing wafer 1100 or 1102. The bonds may then be annealed, for example.

Vertical gaps or grooves 1128 left around newly placed known-good-dies 1124 & 1125 & 1126 may be filled with a fill material 1130, such as an insulator, a dielectric, an oxide, a molding material, a BCB material, or some other polymer, for example. The fill material 1130 may be a material that starts as liquid, for example, and is then cured to be compatible with a chemical-mechanical polishing (CMP) process.

The opposing backsides 1120 & 1122 of the wafers 1100 & 1102 may be thinned or polished to reveal the through-silicon-vias 136. At this point, both sides of the bonded wafers 1100 & 1102, now populated with known-good-dies 1124 & 1125 & 1126, may undergo stacking of additional wafers and/or layers for 3D stack construction.

Example Methods

Figure 12:
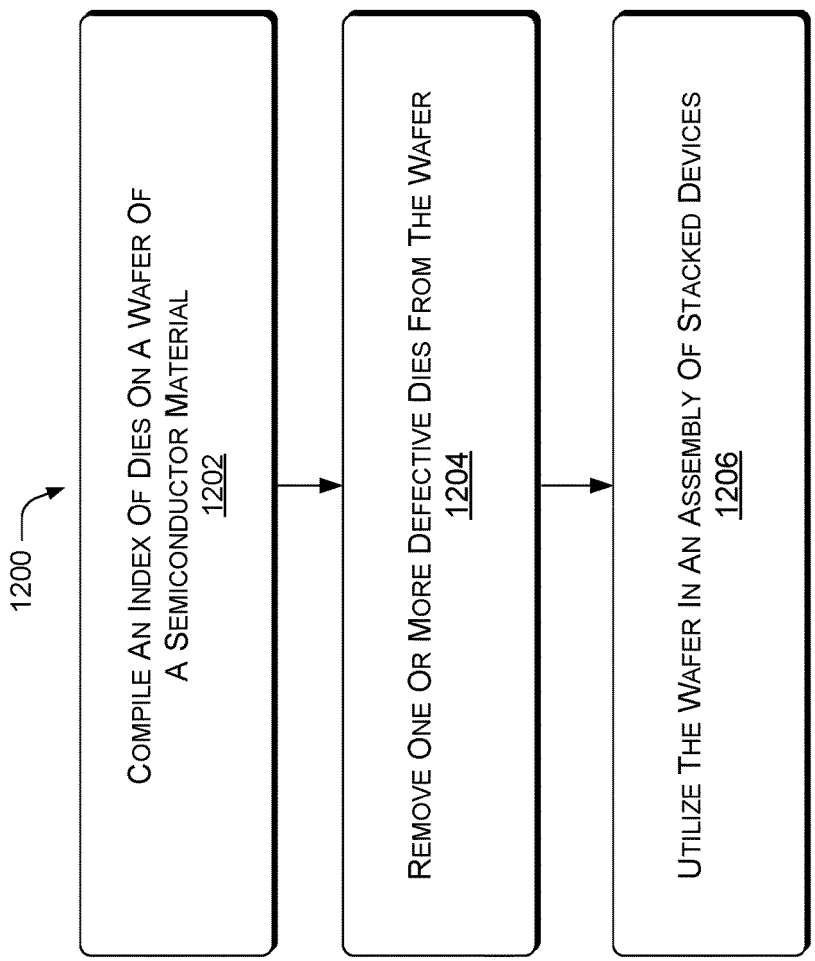
FIG. 12 is a flow diagram of an example method of providing 3D wafer assembly or stack assembly with known-good-dies.

FIG. 12 shows an example method 1200 of providing 3D wafer assembly with known-good-dies. In the flow diagram of FIG. 12, operations of the example method 1200 are shown in individual blocks.

At block 1202, an index of dies on a wafer of a semiconductor material is compiled.

At block 1204, one or more defective dies are removed from the wafer.

At block 1206, the wafer with defective dies removed is utilized in an assembly of stacked devices. The stacked devices may be microelectronics, such as electronics packages, integrated circuit packages, 3D stacked integrated circuit devices, microelectromechanical systems (MEMS), nanoelectromechanical systems (NEMS), or optoelectronics.

Figure 13:
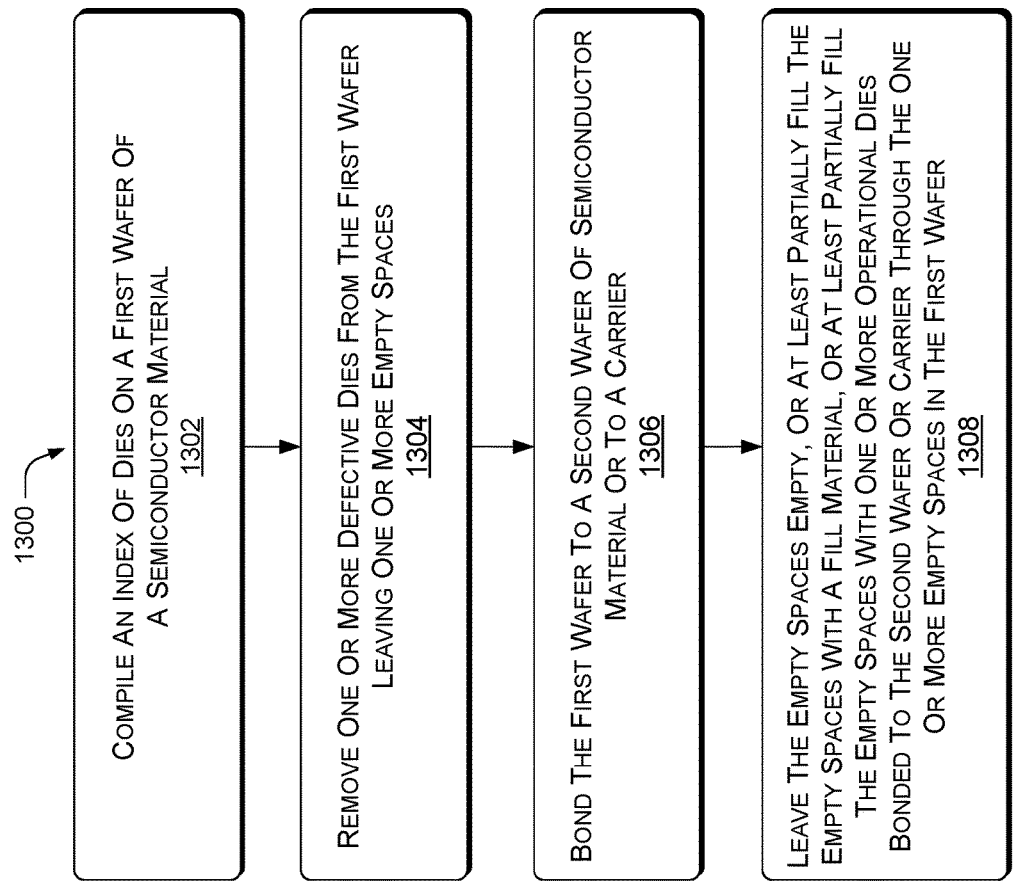
FIG. 13 is a flow diagram of another example method of providing 3D wafer assembly or stack assembly with known-good-dies.

FIG. 13 shows another example method 1300 of providing 3D wafer assembly with known-good-dies. In the flow diagram of FIG. 13, operations of the example method 1300 are shown in individual blocks.

At block 1302, an index of dies on a first wafer of a semiconductor material is compiled.

At block 1304, one or more defective dies are removed from the first wafer leaving one or more empty spaces in the first wafer.

At block 1306, the first wafer is bonded to a second wafer of semiconductor material, or to a carrier.

At block 1308, the one or more empty spaces on the first wafer are either left empty, or are at least partially filled with a fill material, or are at least partly filled with one or more operational dies bonded to the second wafer or carrier through the one or more empty spaces in the first wafer.

Figure 14:
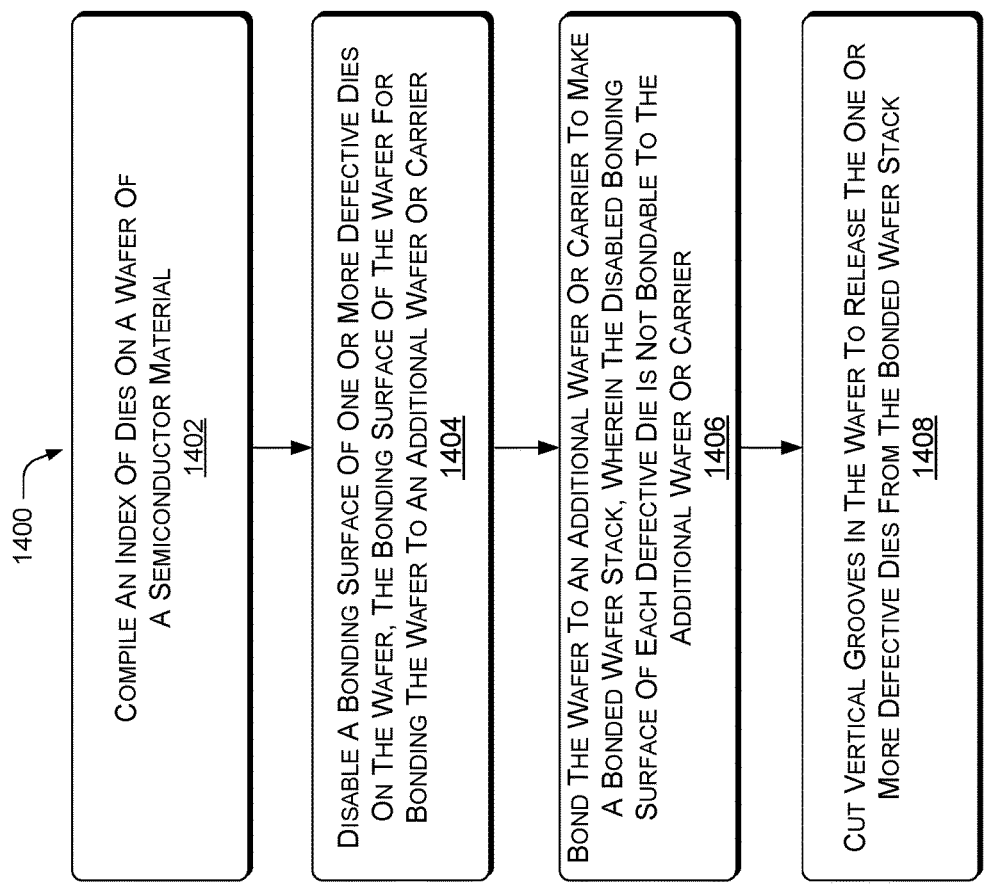
FIG. 14 is a flow diagram of an example method of removing defective dies during stack assembly.

FIG. 14 shows an example method 1400 of removing defective dies during stack assembly. In the flow diagram of FIG. 14, operations of the example method 1400 are shown in individual blocks.

At block 1402, dies on a wafer of a semiconductor are indexed.

At block 1404, a bonding surface of each of one or more defective dies on the wafer is disabled, the bonding surface of the wafer for bonding the wafer to an additional wafer or carrier.

At block 1406, the wafer is bonded to the additional wafer or the carrier to make a bonded wafer, wherein the disabled bonding surface of each defective die is not bondable to the additional wafer or to the carrier.

At block 1408, vertical grooves are cut in the bonded wafer to release the one or more defective dies from the bonded wafer.

Figure 15:
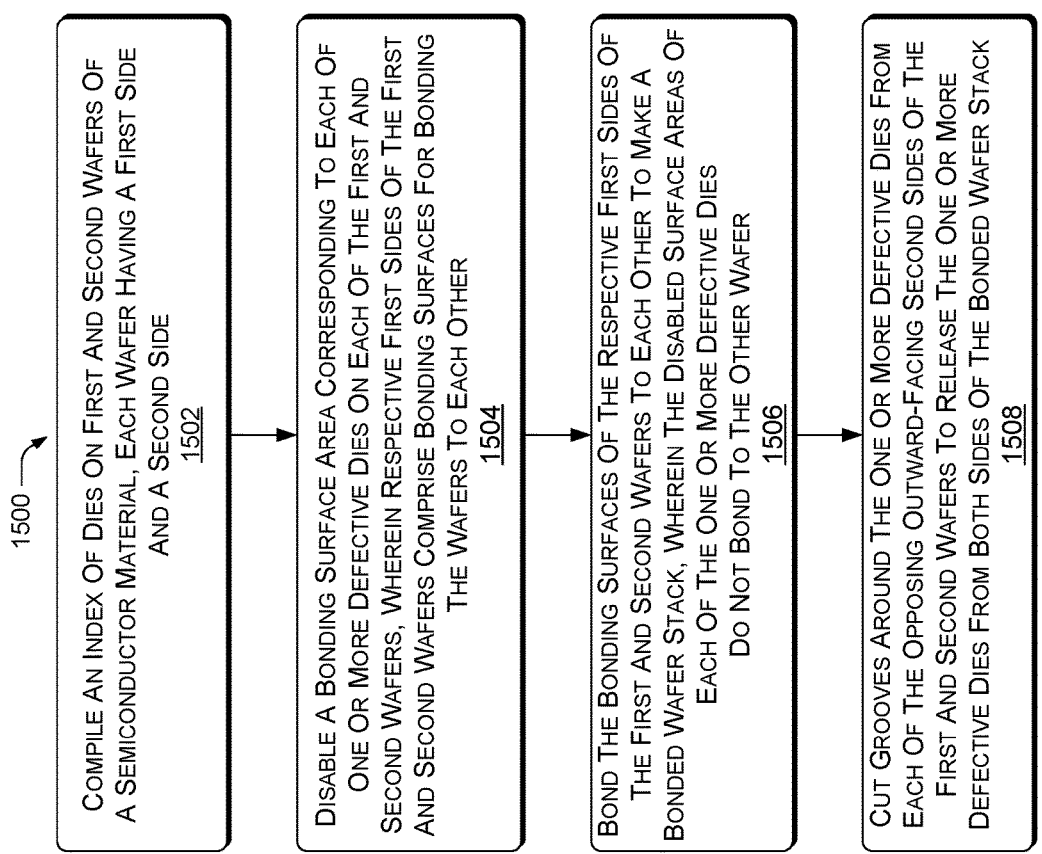
FIG. 15 is a flow diagram of another example method of removing defective dies during stack assembly.

FIG. 15 shows another example method 1500 of removing defective dies during stack assembly. In the flow diagram of FIG. 15, operations of the example method 1500 are shown in individual blocks.

At block 1502, dies on a first wafer of a semiconductor and a second wafer of semiconductor are indexed. Each wafer has a first side and a second side.

At block 1504, a bonding surface area corresponding to each of one or more defective dies on each of the first wafer and the second wafer are disabled, wherein respective first sides of the first and second wafers comprise bonding surfaces for bonding the wafers to each other.

At block 1506, the bonding surfaces of the respective first sides of the first and second wafers are bonded to each other to make a bonded wafer stack. The disabled bonding surface areas of the one or more defective dies do not bond to the other wafer.

At block 1508, grooves are cut around the one or more defective dies from each of the opposing outward-facing second sides of the first and second wafers to release the one or more defective dies from both sides of the bonded wafer stack.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A method, comprising:
    etching or ablating a thin horizontal layer from a front surface of a first wafer of a semiconductor material at the site of each of one or more defective dies of the first wafer;
    bonding the front surface of the first wafer to a second wafer of a semiconductor material in a wafer-to-wafer assembly operation to make a bonded wafer stack, wherein the etched or ablated sites do not bond to the second wafer;
    cutting vertical grooves in the first wafer to release the one or more defective dies from the bonded wafer stack;
    bonding one or more operational dies to the second wafer through one or more holes in the first wafer left by the one or more released defective dies; and
    utilizing the first wafer and the second wafer to form an assembly of stacked electronic devices.

2. The method of claim 1, further comprising at least partly filling empty spaces left by release and removal of multiple defective dies from the first wafer with a filler material.

3. The method of claim 2, wherein the filler material is selected from the group consisting of an insulation, a dielectric, a molding material, an oxide, and a benzocyclobutene (BCB)-based material.

4. The method of claim 1, wherein the removing the one or more defective dies comprises dicing the defective die from the first wafer, the dicing selected from the group consisting of laser dicing, plasma etching, ablation, water jet cutting, chemical etching, and laser grooving.

5. The method of claim 1, further comprising:
    bonding the second wafer to a carrier prior to bonding the first wafer to the second wafer;
    removing one or more defective dies from the second wafer;
    bonding the first wafer to the second wafer; and
    removing the carrier from the second wafer.

6. The method of claim 1, further comprising:
    forming through-silicon-vias in the first wafer;
    thinning a backside of the first wafer;
    bonding the front side of the first wafer to the second wafer, wherein the second wafer comprises a bottom device wafer;
    removing the one or more defective dies from the first wafer leaving one or more empty sites in the first wafer; and
    either filling at least one of the one or more empty sites in the first wafer with one or more operational dies bonded to the bottom device wafer at the one or more empty sites in the first wafer, or filling at least one of the one or more empty sites in the first wafer with a fill material.

7. The method of claim 6, further comprising annealing a bond between the bottom device wafer and the one or more operational dies bonded to the bottom device wafer.

8. The method of claim 6, further comprising:
    thinning the backside to nearly reveal the through-silicon-vias;
    depositing a filler material to fill vertical grooves on the first wafer around the one or more operational dies bonded to the bottom device wafer; and
    polishing, grinding, or thinning the backside to reveal the through-silicon-vias.

9. The method of claim 8, further comprising:
    forming one or more dielectric layers on the backside;
    planarizing the one or more dielectric layers; and
    forming at least one conductive layer adjacent to the one or more dielectric layers, the at least one conductive layer in electrical communication with the through-silicon-vias.

10. The method of claim 9, further comprising bonding more wafers of semiconductor to the first wafer.

11. The method of claim 1, further comprising
    filling gaps around the one or more operational dies with an insulation, a dielectric, a molding material, an oxide, or a benzocyclobutene (BCB)-based material.

12. The method of claim 6, further comprising:
    thinning or polishing the backside to reveal the through-silicon-vias; and
    stacking one or more additional wafers on the wafer, the one or more additional wafers prepared in a same process as the wafer in a parallel manufacturing operation.

13. The method of claim 1, further comprising:
    etching or ablating a thin horizontal layer from a front surface of the second wafer at the site of each of one or more defective dies of the second wafer;

bonding the front surface of the first wafer to a front surface of the second wafer in the wafer-to-wafer assembly operation to make the bonded wafer stack;

cutting vertical grooves in the first wafer and in the second wafer from opposing sides of the bonded wafer stack to release the defective dies from both sides of the bonded wafer stack; and bonding operational dies to both the first wafer and the second wafer through the holes in the first wafer and the second wafer left by the release of the defective dies of the first and second wafers.

14. The method of claim 1, wherein the bonding in the wafer-to-wafer assembly operation comprises direct bonding or direct hybrid bonding.

* * * * *